(12) United States Patent
Koski

(10) Patent No.: US 7,679,362 B2
(45) Date of Patent: Mar. 16, 2010

(54) HALL-EFFECT PRESSURE SWITCH

(75) Inventor: Jack P. Koski, South Lyon, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 92 days.

(21) Appl. No.: 11/654,903

(22) Filed: Jan. 18, 2007

(65) Prior Publication Data
US 2008/0174300 A1    Jul. 24, 2008

(51) Int. Cl.
*G01R 33/06*    (2006.01)
*H01L 43/06*    (2006.01)

(52) U.S. Cl. ............... 324/207.2; 73/861.13; 335/205; 335/238; 335/295; 335/304

(58) Field of Classification Search ............ 335/205, 335/238, 295, 304
See application file for complete search history.

(56) References Cited

U.S. PATENT DOCUMENTS

| | | | | |
|---|---|---|---|---|
| 4,293,814 A | * | 10/1981 | Boyer | 324/166 |
| 5,057,807 A | * | 10/1991 | Longly et al. | 335/207 |
| 5,373,125 A | * | 12/1994 | Ford et al. | 200/61.52 |
| 6,184,764 B1 | * | 2/2001 | Edwards et al. | 335/205 |
| 6,380,733 B1 | * | 4/2002 | Apel et al. | 324/207.2 |
| 6,670,873 B2 | * | 12/2003 | Inada et al. | 335/205 |
| 6,981,421 B2 | * | 1/2006 | Palmer et al. | 73/735 |
| 7,068,132 B2 | * | 6/2006 | Asa | 335/205 |
| 7,326,869 B2 | * | 2/2008 | Flynn et al. | 200/341 |
| 2003/0030521 A1 | * | 2/2003 | Sweet et al. | 335/205 |
| 2006/0278011 A1 | * | 12/2006 | Miyasaka et al. | 73/753 |
| 2006/0290451 A1 | * | 12/2006 | Prendergast et al. | 335/205 |
| 2007/0241613 A1 | * | 10/2007 | Koski | 307/10.1 |
| 2008/0148807 A1 | * | 6/2008 | Berry et al. | 73/1.57 |

* cited by examiner

*Primary Examiner*—Anh T Mai
*Assistant Examiner*—Mohamad A Musleh

(57) ABSTRACT

A switch includes housing and a magnet that is mounted inside the housing. The magnet generates a magnetic field having magnetic flux. The switch further includes a flux concentration device that is located inside the housing and that selectively moves between first and second positions. An actuator assembly is located inside the housing and selects the first and second positions based on the input. A hall-effect device is located between the magnet and the flux concentration device and conducts a current having a first value when the magnetic flux is less than a predetermined magnetic flux threshold. The hall-effect device conducts current having a second current value when the magnetic flux exceeds the predetermined magnetic flux threshold. The first position communicates a first magnetic flux to the hall-effect device and the second position communicates a second magnetic flux that is different from the first magnetic flux to the hall-effect device.

17 Claims, 3 Drawing Sheets

HALL-EFFECT PRESSURE SWITCH

FIELD OF THE INVENTION

The present invention relates to vehicle diagnostic systems, and more particularly to a switch system for detecting faults in an electrical circuit.

BACKGROUND OF THE INVENTION

Single throw switches can be used in vehicles to detect the presence of an input, such as fluid pressure. A simple switch includes two metal contacts that selectively connect to conduct current and complete a circuit. Although metal contacts are an acceptable means of conducting current flow, the contacts can form insulating oxides that corrode the metal and prevent the circuit from working properly.

Single throw switches operate in two modes, or positions. A first position separates the two contacts to provide an open circuit. A second position connects the contacts to complete the circuit (i.e. close the circuit) and to provide a current path. Accordingly, single throw switches are convenient for switching power to a circuit. However, further applications are limited.

SUMMARY OF THE INVENTION

Accordingly, the present invention provides a switch for detecting an input. The switch includes a switch housing and a magnet that is mounted inside the switch housing and that generates a magnetic field having magnetic flux. The switch further includes a flux concentration device that is located inside the switch housing and that selectively moves between first and second positions. Furthermore, an actuator assembly is located inside the switch housing that receives an input and that selects the first and second positions based on the input. The switch further includes a hall-effect device that is located between the magnet and the flux concentration device. The hall-effect device conducts a current having a first value when the magnetic flux is less than a predetermined magnetic flux threshold and that conducts the current having a second current value when the magnetic flux exceeds the predetermined magnetic flux threshold. The first position communicates a first magnetic flux to the hall-effect device and the second position communicates a second magnetic flux that is different from the first magnetic flux to the hall-effect device.

In other features, the switch further includes a metal plate mounted on the inner base of the switch housing. The switch includes a first terminal that has one end that communicates with one side of the hall-effect device and that has an opposite end that communicates with the metal plate. The switch includes a second terminal that has one end that communicates with a side of the hall-effect device opposite of the first terminal and that has an opposite end that extends through the switch housing and outside the switch.

In still other features, the switch of claim 1 further includes an inlet. The switch includes a fluid sealing device fixed to the inlet and a chamber located inside the switch housing that is adapted to hold fluid. The inlet directs the fluid to the chamber.

In yet other features, the switch includes a pressure detection device adapted to detect a fluid pressure and a linking rod having one end that is coupled to the pressure detection device and having an opposite end that is coupled to the flux concentration device.

In another feature, the pressure detection device is a deformable membrane that receives a fluid and deforms based on a fluid pressure caused by the fluid. The fluid pressure causes deformation of the membrane and moves the flux concentration device toward the hall-effect device.

In another feature, the flux concentration device is coupled to the base inside the switch housing using springs. When the fluid is not received, the springs position the flux concentration device a first distance away from the hall-effect device. When the fluid is received, the springs compress and position the flux concentration device a second distance away from the hall-effect device.

In still another feature, the second distance is less than the first distance.

In yet another feature, the second magnetic flux has a higher strength then the first magnetic flux.

In still another feature, the magnetic flux threshold includes an upper magnetic flux value and a lower magnetic flux value.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1A:
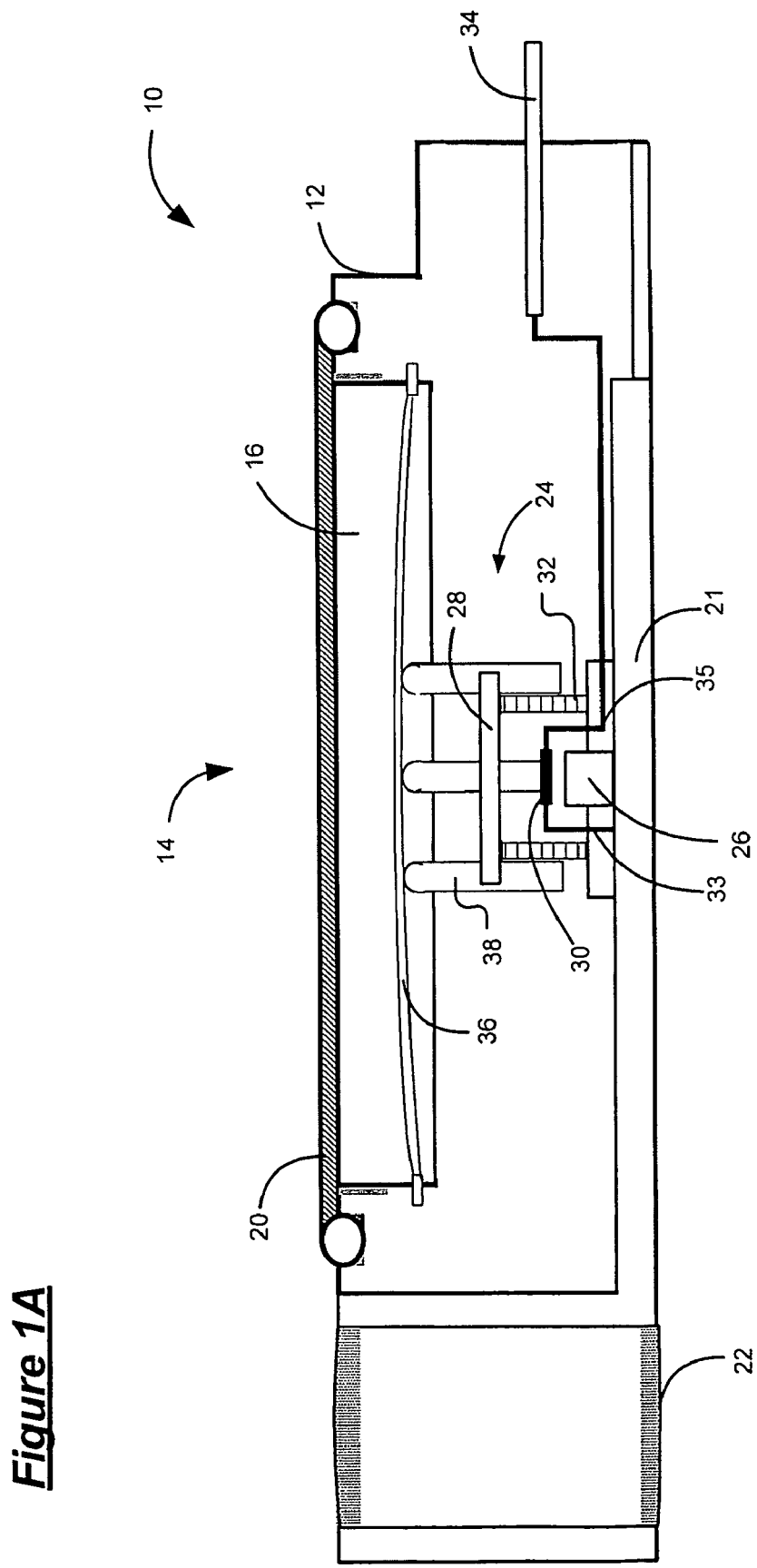
FIGS. 1A and 1B are cross-sectional functional block diagrams of a hall-effect switch according to the principles of the present invention.

The following description of the preferred embodiment is merely exemplary in nature and is in no way intended to limit the invention, its application, or uses. For purposes of clarity, the same reference numbers will be used in the drawings to identify similar elements.

Figure 1B:
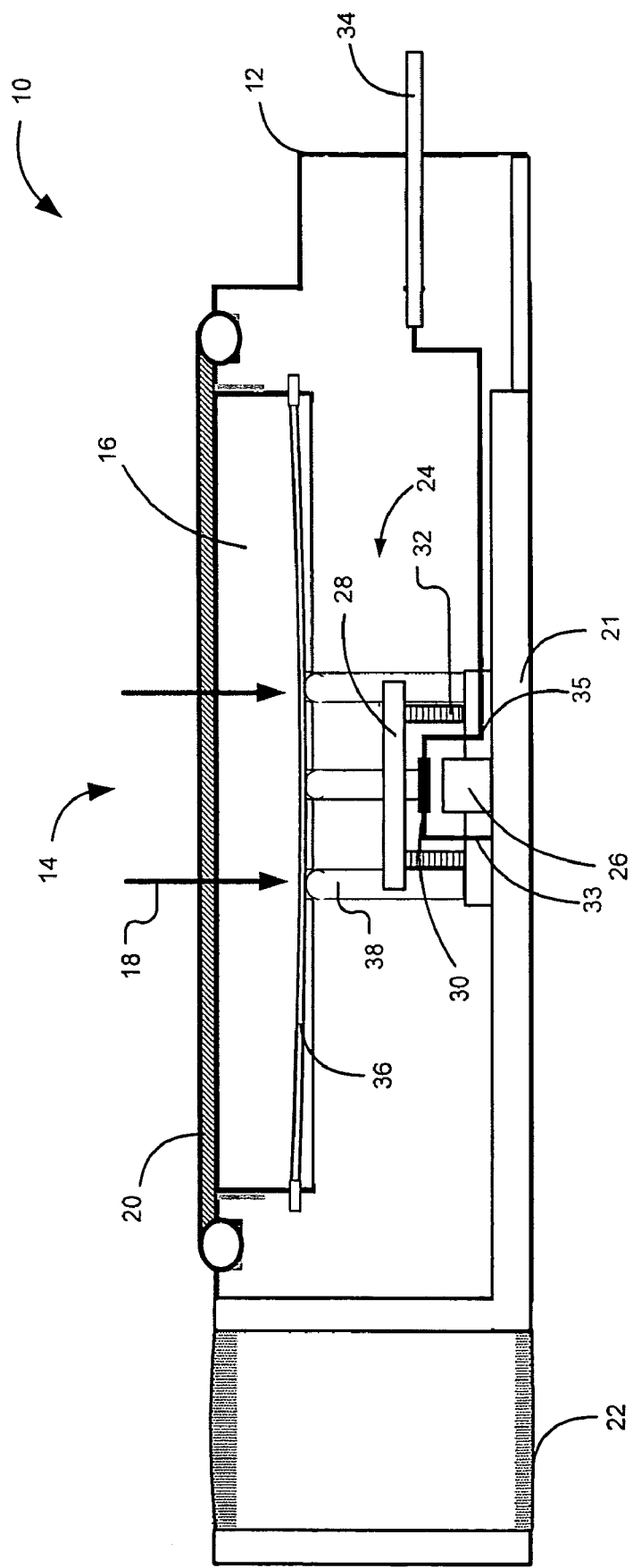

Referring now to FIGS. 1A and 1B, an exemplary hall-effect switch 10 adapted to detect fluid pressure is shown. The hall-effect switch 10 includes an outer housing 12 having a top 14 and a pressure chamber 16 within the housing that holds fluid 18. The top couples to a fluid pressure source (not shown) and functions as an inlet to direct fluid 18 to the pressure chamber 16. A sealing device 20 is attached to the housing 12 and surrounds the top 14 to prevent fluid 18 from escaping the switch 10. A metal plate 21 is disposed on the inner base of the housing. A mounting fixture 22 can be coupled to one side of the switch where it couples to the metal plate 21. When the mounting fixture 22 contacts a ground source (not shown), the metal plate become grounded, thereby providing a ground point inside the switch 10.

A switch assembly 24 is located within the housing 12. The switch assembly 24 includes a magnet 26, a flux concentration device 28 and a hall-effect device 30. The magnet 26 is fixed to the metal plate 21 and generates a magnetic field (not shown) having magnetic flux (not shown). Although the magnet is shown to be directly mounted to the metal plate 21, the magnet can be mounted to the base of the housing 12. The flux concentration device is located above the magnet 26 and is coupled to the base of the housing 12 using springs 32. The flux concentration device 28 provides a lower resistance path for the magnetic flux. The strength of the magnetic flux can be adjusted by adjusting the position of the flux concentration device 28. For example, the strength of the magnetic flux increases as the flux concentration device 28 moves closer to the magnet 26. The flux concentration device 28 can include a plate made of ferromagnetic material, or another material capable of amplifying magnetic flux.

The hall-effect device 30 is located between the magnet 26 and the flux concentration device 28. One end of the hall-effect device 30 communicates with the metal plate 21 using a first lead 33. The opposite end communicates with a terminal 34 using a second lead 35. The terminal 34 extends through the housing 12 and outside of the switch 10.

A voltage potential is created across the hall-effect device 30 and a constant biased current flows therein when the metal plate 21 communicates with a ground source (not shown) and the terminal 34 communicates with a voltage source (not shown). Further, placing the hall-effect device 30 in a magnetic field where magnetic flux is received at approximately 90° to the current flow creates a voltage output that is directly proportional to the strength of the magnetic flux. Accordingly, the hall-effect device 30 can include a magnetic flux threshold. When the magnetic flux is below the threshold, the hall-effect device 30 can output a current having a first value. When the magnetic flux exceeds the threshold, the hall-effect device can output a current having a second value.

A deformable membrane 36 is centered in the pressure chamber 16 and above the flux concentration device 28. The sides of the membrane 36 are coupled to the inside walls of the housing 12. The bottom of the membrane 36 is coupled to one end of a linking rod 38. The opposite end of the linking rod 38 is coupled to the flux concentration device 28.

The switch 10 operates in first and second modes based on the position of the membrane 36. A first mode (LO) can exist when the pressure chamber 16 contains no fluid 18 and the membrane 36 flexes away from the hall-effect device 30. When the membrane 36 flexes away from the hall-effect device 30, the springs 32 are decompressed, thereby holding the flux concentration device 28 in a first position. When the switch 10 is connected to a circuit while in the first position, the flux concentration device 28 delivers a weak magnetic flux to the hall-effect device 30. As a result, the hall-effect device 30 conducts a current in the range of 2 mA-5 mA.

A second mode can exist when fluid 18 is delivered to the pressure chamber 16. As fluid 18 fills the pressure chamber 16, fluid pressure created by the fluid 18 forces the membrane 36 toward the hall-effect device 30. The linking rod 38 moves the flux concentrator device 28 toward the hall-effect device 30 and into the second position. The second position places the flux concentration device 28 a short distance away from the hall-effect device 30, thereby delivering a high strength magnetic flux. Accordingly, the hall-effect device 30 conducts a current in the range of 12 mA-17 mA. Although the hall-effect conducts current in the ranges of 2 mA-5 mA and 12 mA-17 mA, it is appreciated that another hall-effect that can conduct different current ranges may be used.

By using a hall-effect device to conduct current problems caused by corroding metal contacts are reduced. Furthermore, the ability to conduct two different current strengths allows the switch to be used in a wide variety of applications.

Figure 2:
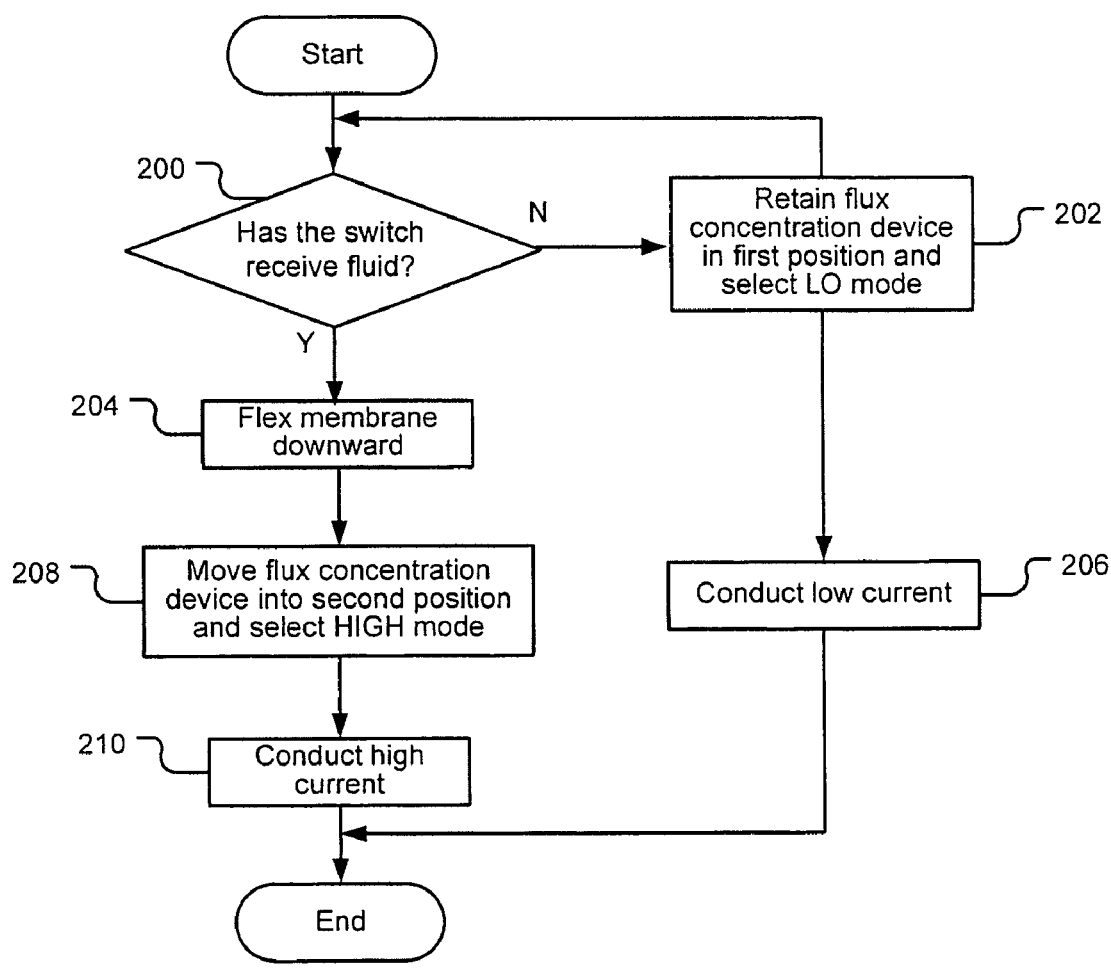
FIG. 2 is a flow chart illustrating steps executed by a hall-effect switch coupled with a circuit according to the principles of the present invention.

Referring now to FIG. 2, a flowchart illustrates steps executed by a hall-effect switch that is coupled to a circuit according to the principles of the present invention. In step 200, control determines whether the switch has received fluid. When the switch has received fluid, control proceeds to step 204. Otherwise control proceeds to step 202. In step 202, control retains a flux concentration device 28 in a first position and selects a LO mode. Control conducts a low current in step 206 and control ends.

In step 204, control flexes the membrane toward the hall-effect device. In step 208, control moves the flux concentration device to a second position and selects a HIGH mode. Control conducts a high current in step 210 and control ends.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A switch, comprising:
   a switch housing;
   a magnet that is mounted inside said switch housing and that generates a magnetic field having magnetic flux;
   a flux concentration device that is located inside said switch housing and that selectively moves between first and second positions;
   an actuator assembly that includes a pressure detection device coupled to said flux concentration device, wherein said actuator assembly is located inside said switch housing, and wherein said pressure detection device receives an input and selects said first and second positions based on said input; and
   a hall-effect device that is located between said magnet and said flux concentration device, that conducts a current having a first value when said magnetic flux is less than a predetermined magnetic flux threshold and that conducts said current having a second current value when said magnetic flux exceeds said predetermined magnetic flux threshold,
   wherein said first position communicates a first magnetic flux to said hall-effect device and said second position communicates a second magnetic flux that is different from said first magnetic flux to said hall-effect device.

2. The switch of claim 1 further comprising:
   a metal plate mounted on an inner base of said switch;
   a first terminal that has one end that communicates with one side of said hall-effect device and that has an opposite end that communicates with said metal plate; and
   a second terminal that has one end that communicates with a side of said hall-effect device opposite of said first terminal and that has an opposite end that extends through said switch housing and outside said switch.

3. The switch of claim 1 wherein said switch housing comprises:
   an inlet;
   a fluid sealing device fixed to said inlet; and
   a chamber located inside said switch housing and that is adapted to hold fluid,
   wherein said inlet directs said fluid to said chamber.

4. The switch of claim 3, wherein said pressure detection device detects a pressure of said fluid.

5. The switch of claim 1 wherein said pressure detection device is coupled to said flux concentration device using a linking rod, wherein said linking rod has one end that is coupled to said pressure detection device and has an opposite end that is coupled to said flux concentration device.

6. The switch of claim 1 wherein said pressure detection device is a deformable membrane that receives a fluid and deforms based on a fluid pressure caused by said fluid such that said fluid pressure causes deformation of said membrane and moves said flux concentration device toward said hall-effect device.

7. The switch of claim 1 wherein said flux concentration device is coupled to a base inside said switch housing springs, wherein, when a fluid is not received, said springs position said flux concentration device a first distance away from said hall-effect device, and wherein, when said fluid is received, said springs compress and position said flux concentration device a second distance away from said hall-effect device.

8. The switch of claim 7 wherein said second distance is less than said first distance.

9. The switch of claim 1 wherein said second magnetic flux has a higher strength than said first magnetic flux.

10. The switch of claim 1 wherein said magnetic flux threshold includes an upper magnetic flux value and a lower magnetic flux value.

11. A method of detecting an input, comprising:

receiving said input using a pressure detection;

generating a magnetic field having a magnetic flux using a magnetic source and a flux concentration device;

selectively moving said flux concentration device between first and second positions based on said input;

conducting current having first and second current strengths using a hall-effect device that is located between said magnetic source and said flux concentration device;

conducting said first current strength when said magnetic flux is less than a predetermined magnetic flux threshold; and conducting said second current strength when said magnetic flux exceeds said predetermined magnetic flux threshold, wherein said first position communicates a first magnetic flux to said hall-effect device and said second position communicates a second magnetic flux that is different from said first magnetic flux to said hall-effect device.

12. The method of claim 11 wherein said pressure detection device includes a deformable membrane.

13. The method of claim 12 further comprising coupling one end of a linking rod to said deformable membrane and coupling an opposite end of said linking rod to said flux concentration device.

14. The method of claim 12 further comprising detecting a fluid pressure using a deformable membrane that receives a fluid and deforms based on a fluid pressure of said fluid such that said fluid pressure causes deformation of said membrane and moves said flux concentration device toward said hall-effect device.

15. The method of claim 11 wherein said second magnetic flux has a higher strength than said first magnetic flux.

16. The method of claim 11 wherein said magnetic flux threshold includes an upper magnetic flux value and a lower magnetic flux value.

17. A switch, comprising:

a switch housing;

a magnet that is mounted inside said switch housing and that generates a magnetic field having magnetic flux;

a flux concentration device that is located inside said switch housing and that selectively moves between first and second positions;

an actuator assembly that includes a pressure detection device coupled to said flux concentration device, wherein said actuator assembly is located inside said switch housing, and wherein said pressure detection device receives an input and selects said first and second positions based on said input; and a hall-effect device that is located directly between said magnet and said flux concentration device, that conducts a current having a first value when said magnetic flux is less than a predetermined magnetic flux threshold and that conducts said current having a second current value when said magnetic flux exceeds said predetermined magnetic flux threshold, wherein said flux concentration device communicates a first magnetic flux to said hall-effect device when in said first position and said flux concentration device communicates a second magnetic flux that is different from said first magnetic flux to said hall-effect device when in said second position.

* * * * *